(12) United States Patent
Ogata et al.

(10) Patent No.: US 7,511,288 B2
(45) Date of Patent: Mar. 31, 2009

(54) ION IMPLANTATION DEVICE

(75) Inventors: Seiji Ogata, Chigasaki (JP); Yuzo Sakurada, Susono (JP); Masayuki Sekiguchi, Toshima-Ku (JP); Tsutomu Nishihashi, Susono (JP)

(73) Assignee: Ulvac Co., Ltd, Chigasaki (JP)

( * ) Notice: Subject to any disclaimer, the term of this patent is extended or adjusted under 35 U.S.C. 154(b) by 149 days.

(21) Appl. No.: 11/575,197

(22) PCT Filed: Nov. 14, 2005

(86) PCT No.: PCT/JP2005/020872

§ 371 (c)(1),
(2), (4) Date: Mar. 13, 2007

(87) PCT Pub. No.: WO2006/054528

PCT Pub. Date: May 26, 2006

(65) Prior Publication Data

US 2008/0054192 A1    Mar. 6, 2008

(30) Foreign Application Priority Data

Nov. 19, 2004  (JP) .............................. 2004-335845

(51) Int. Cl.
*H01J 37/02* (2006.01)

(52) U.S. Cl. .............................. 250/492.21; 250/492.1; 250/492.2; 250/492.3; 250/396 R; 250/398; 250/400; 250/396 ML; 427/523; 438/514

(58) Field of Classification Search .............. 250/492.1, 250/492.2, 492.21, 492.3, 396 R, 398, 400, 250/396 ML; 427/523; 438/514

See application file for complete search history.

(56) References Cited

U.S. PATENT DOCUMENTS

| 5,343,047 A | * | 8/1994 | Ono et al. ............... 250/492.21 |
| 5,656,092 A | * | 8/1997 | Blake et al. ........... 118/723 VE |
| 5,998,798 A | * | 12/1999 | Halling et al. ......... 250/492.21 |

FOREIGN PATENT DOCUMENTS

| JP | 53 102677 | 9/1978 |
| JP | 63 271856 | 11/1988 |
| JP | 4 226021 | 8/1992 |
| JP | 11 329316 | 11/1999 |

* cited by examiner

*Primary Examiner*—Jack I Berman
*Assistant Examiner*—Michael Maskell
(74) *Attorney, Agent, or Firm*—Oblon, Spivak, McClelland, Maier & Neustadt, P.C.

(57) ABSTRACT

To provide an ion implantation device which suppresses diffusion of an ion beam, can finely control a scanning waveform and can obtain a large scanning angle of about 10°.

In the ion implantation device, first, second and third chambers 12A, 14A and 16A are arranged in predetermined places on a beam line, first and second gaps 20A and 22A intervene between the first chamber 12A and the second chamber 14A and between the second chamber 14A and the third chamber 16A, the second chamber 14A is electrically insulated from the first and third chambers 12A and 16A via first and second electrode pairs 26A and 28A attached to the first and second gaps 20A and 22A, respectively, the first and second electrode pairs 26A and 28A obliquely cross a standard axis J of the ion beam at a predetermined angle in opposite directions, and the second chamber 14 is connected to a scanning power source 40A which applies an electric potential having desired scanning waveform.

12 Claims, 11 Drawing Sheets

ION IMPLANTATION DEVICE

TECHNICAL FIELD

The present invention relates to an ion implantation device, and particularly relates to the ion implantation device which has a chamber divided type ion beam scanning mechanism for suppressing diffusion of an ion beam due to a space-charge effect so as to be capable of obtaining a large scanning angle even with a case of an ion beam having high electrostatic potential.

BACKGROUND ART

Various types of ion implantation devices, which accelerate ions from an ion source to desired energy and implant the energy into surfaces of substrates such as semiconductor wafers, are put into practical use (see Patent Document 1).

One example of conventional ion implantation device is explained below with reference to FIG. 11.

FIG. 11 is a plan view illustrating a schematic configuration of the conventional ion implantation device.

A main configuration of the ion implantation device 100 includes, as shown in FIG. 11, an ion source 110, a mass separator 120, a mass separating slit 130, an accelerating tube 140, a quadrupole lens 150, a scanner 160, and a parallelizing device 170.

The reference numeral 180 in the drawing denotes a substrate to be a target into which ions arranged in an end station, not shown, are implanted.

Further, the reference character B denotes ions, but they are occasionally called "ion beam" or "beam".

The ion source 110 is a device which rips off electrons from atoms and molecules so as to create ions. The mass separator 120 is a device which generates a magnetic field or an electric field, or both of them utilizing a property such that charge molecules such as ions and electrons are deflected in the magnetic field or the electric field so as to specify ion species to be desirably implanted into the substrate 180.

The accelerating tube 140 is a device which accelerates or decelerates desired ion species passing through the mass separating slit 130, but as shown in FIG. 11, normally a plurality of electrode pairs are arranged with uniform intervals axisymmetrically, a high voltage which is equal to the electrode paris is applied so that the ion beam B is accelerated or decelerated so as to be desired implantation energy by the function of an electrostatic field.

The scanner 160 generates an external electric field which is uniform in a direction orthogonal to an advancing direction of the ion beam B, changes polarity and strength of the electric field so as to control a deflection angle of the ions, and as shown in FIG. 11, scans a desired position on the implantation surface of the substrate 180 with the ions B so as to implant the ions B uniformly.

For simplification, FIG. 11 illustrates one electrode pair of the scanner 160 for deflecting the ion beam B to a horizontal direction, but the scanner 160 may deflect it to a vertical direction.

The parallelizing device 170 is an electric magnet which utilizes the property such that the ions B as charge molecules are deflected in the magnetic field so as to suppress diffusion of the beam according to a difference in paths of the respective ions composing the ion beam B and allow the beam B to enter the substrate 180 parallel.

Not shown, but a chamber which is maintained in high vacuum is disposed from the ion source 110 to the substrate 180, and the ion beam B advances through the chamber from the ion source 110 to the substrate 180.

In the above configuration, a basic operation of the conventional ion implantation device 100 is explained below with reference to FIG. 11.

In the conventional ion implantation device 100, since the predetermined ion species are implanted into the entire implantation surface of the substrate 180 for the ions B at uniform density by predetermined energy, for example, the ion beam B which is drawn out from the ion source 110 by energy of about 30 keV is deflected by the mass separator 120, and only predetermined ion species are sorted out by the mass separating slit 130.

The sorted-out ion beam B is accelerated or decelerated into energy of about 10 to 500 keV by the accelerating tube 140, and an external electric field with cycle of about 1 kHz, for example, is applied by the electrostatic type scanner 160 having two electrode pairs which carries out scan with the ion beam B to the horizontal or vertical direction, so that the scanning surface of the substrate 180 is scanned.

The above case picks up the electrostatic type scanner 160 which carried out the scanning with the ion beam B using the external electric field, but instead of the electrostatic type scanner 160, a magnetic type scanner is occasionally used.

As shown in FIG. 11, it is often the case that an adjusting device such as a quadrupole lens 150 is provided between the accelerating tube 140 and the scanner 160 in order to adjust a beam spot shape of the ion beam B on the substrate 180.

Since a depth that the ions B enter a solid can be accurately controlled by the energy of the ions B, for example, when a distribution of the dose amount of the ion beam B is monitored at the time of starting up the ion implantation device 100, the desired ion species can be subject to uniform ion implantation process by scanning the scanning surface of the substrate 180 with the ion beam B.

The ion beam scanning mechanism of a second conventional ion implantation device is explained below simply.

The scanning mechanism of the second conventional ion implantation device is shown in FIG. 3 of Patent Document 2, but a scanning electric magnet having a laminated structure is provided in order to avoid a reduce in the magnetic field due to an eddy current, and an exciting current which is allowed to flow in the scanning electric magnet is modulated at a high speed of about 500 Hz, so that the scanning with ion beam is carried out.

The ion beam scanning mechanism of a third conventional ion implantation device is explained below simply.

The scanning mechanism of the third conventional ion implantation device is shown in FIG. 1 of Patent Document 3, but a deflecting electric magnet for deflecting an ion beam in a predetermined plane with respect to a standard axis as a center trajectory is provided onto a beam line, a deflection chamber portion provided with the deflecting electric magnet in the chamber through which the ion beam passes is electrically independent, and an electric potential of the deflection chamber is modulated so that the scanning with the ion beam is carried out.

Patent Document 1: Japanese Patent Application Laid-Open (JP-A) No. 8-213339

Patent Document 2: JP-A No. 4-253149

Patent Document 3: JP-A No. 53-102677

Non-Patent Document 1: S. Ogata et al. Proceedings of Int. Conf. on Ion Implantation Technology, IEEEE 98 EX144 (1999) 403

DISCLOSURE OF THE INVENTION

Problem to be Solved by the Invention

According to miniaturization of semiconductor devices, throughput is demanded to be improved in the ion implantation devices due to implantation efficiency of ions to be implanted into a substrate.

Further, in order to heighten the throughput in the ion implantation devices, it is essential to increase a beam current.

On the other hand, one of great factors which limits the beam current is diffusion of a beam due to the space-charge effect.

Space charges are supplementary explained.

An ion beam is one system where a particle group having the same charges advances to a designed scanning direction.

Therefore, a Coulomb repulsive force is applied to respective ions in the ion beam, and the Coulomb force which acts between the particles should be considered in order to quantitatively analyze their accurate motion, but when the number of ions is enormous, the total of the Coulomb forces cannot be calculated.

When the ion beam is considered as the system where the space charges distribute, an electric field generated by the space charges is analyzed so that motion of the ion beam can be quantitatively calculated.

In general, in a region where no electrostatic field is present, electrons generated due to collision against residual gas and secondary electrons generated due to collision against inner walls are captured in the ion beam due to a positive electric potential of the ion beam, and the space charges of the ion beam are neutralized.

In a region where the electrostatic field is present, however, since neutralization of the space charges is not enhanced, the diffusion of the ion beam due to the space charges is recognizable.

Therefore, inside the parallel flat plate type scanner of the first conventional ion implantation device, the diffusion of the ion beam due to the space-charge effect is recognizable, and thus the ion beam current is limited.

Further, in the case of the scanning with the ion beam using the electric magnet like the second conventional ion implantation device, the diffusion of the beam due to the space-charge effect in the scanner is avoided, but since the electric current of the electric magnet is modulated, it is difficult to finely adjust a scanning waveform.

Furthermore, in the third conventional ion implantation device, since the deflecting electric magnet is used, the diffusion of the beam due to the space-charge effect is avoided, and the fine adjustment of the scanning waveform is enabled.

However, the following problem arises.

The problem of the third conventional ion implantation device is explained by using the expression.

In the configuration of the scanning mechanism in the third conventional ion implantation device, the scanning angle of the ion beam is expressed by the following expression (1) as described in Patent Document 1:

[Expression 1]

$$\delta\theta = -\frac{V}{2\phi}[\tan\beta(1-\cos\chi) - \sin\chi] \quad (1)$$

The reference symbol $\delta\theta$ denotes the scanning angle of the scanning mechanism, the reference symbol $\chi$ denotes a deflection angle of the standard axis, The reference character V denotes a modulated voltage, The reference symbol $\phi$ denotes an electrostatic potential of the entering ion beam, and the reference symbol $\beta$ denotes a diagonal incident angle. An absolute value of the modulated voltage V is assumed to be sufficiently smaller than the electrostatic potential $\phi$ of the ion beam.

An upper limit of the modulated voltage V is about 20 kV, and an upper limit of the diagonal incident angle $\beta$ is about 45° due to optical characteristic.

For this reason, when the electrostatic potential $\phi$ is 200 kV, an upper limit of the scanning angle $\delta\theta$ is about 3°.

In the case of the ion beam with high electrostatic potential $\phi$, the third conventional ion implantation device cannot obtain the large scanning angle $\delta\theta$.

It is an object of the present invention to solve the above conventional problems and provide an ion implantation device which has an ion beam scanning mechanism which suppresses diffusion of ion beam due to a space-charge effect, can finely control a scanning waveform, and can obtain a large scanning angle of about 10° even with an ion beam having high electrostatic potential.

Further, it is another object of the present invention to provide an ion implantation device which has a scanning mechanism for carrying out parallel scanning with an ion beam while an angle of the ion beam with respect to a standard axis is maintained constant.

Means to Solve the Problems

An ion implantation device according to claim 1, which draws out desired ion species from an ion source for creating ions, accelerates or decelerates the ion species into desired energy and scans an implantation surface of a substrate with an ion beam so as to implant the ion beam thereinto, comprises a chamber divided type ion beam scanning mechanism constituted so that first, second and third chambers for allowing the ion beam to pass through are arranged in predetermined places on a beam line of the ion implantation device in this order from an upper stream side, a first gap intervenes between the first chamber and the second chamber, and a second gap intervenes between the second chamber and the third chamber, the second chamber is electrically insulated from the first and third chambers via the first and second gaps, and any one of the first and second gaps obliquely crosses a standard axis of the ion beam at a predetermined angle, the second chamber is connected to a scanning power source which applies an electric potential having desired scanning waveform.

An ion implantation device according to claim 2, which draws out desired ion species from an ion source for creating ions, accelerates or decelerates the ion species into desired energy and scans an implantation surface of a substrate with an ion beam so as to implant the ion beam thereinto, comprises a chamber divided type ion beam scanning mechanism constituted so that first to nth and nth to N+2nd chambers for allowing the ion beam to pass through are arranged in predetermined places on a beam line of the ion implantation device in this order from an upper stream side, an n−1st gap intervenes between the n−1st chamber and the nth chamber, and a nth gap intervenes between the nth chamber and the n+1st chamber, the nth chamber is electrically insulated from the n−1st and n+1st chambers via the n−1st and nth gaps, and any one of the n−1st and nth gaps obliquely crosses a standard axis of the ion beam at a predetermined angle, the nth chamber is connected to a scanning power source which applies an electric potential having desired scanning waveform.

However, N is a natural number, n is a natural number from 2 to N+1 which shifts one by one.

An ion implantation device according to claim 3, which draws out desired ion species from an ion source for creating ions, accelerates or decelerates the ion species into desired energy and scans an implantation surface of a substrate with an ion beam so as to implant the ion beam thereinto, comprises a chamber divided type ion beam scanning mechanism constituted so that first, second and third chambers for allowing the ion beam to pass through are arranged in predetermined places on a beam line of the ion implantation device in this order from an upper stream side, a first gap intervenes between the first chamber and the second chamber, and a second gap intervenes between the second chamber and the third chamber, the second chamber is electrically insulated from the firs and third chambers via the first and second gaps, and the two first and second gaps obliquely cross a standard axis of the ion beam at a predetermined angle in opposite directions, the second chamber is connected to a scanning power source which applies an electric potential having desired scanning waveform.

An ion implantation device according to claim 4, which draws out desired ion species from an ion source for creating ions, accelerates or decelerates the ion species into desired energy and scans an implantation surface of a substrate with an ion beam so as to implant the ion beam thereinto, comprises a chamber divided type ion beam scanning mechanism constituted so that first to nth and nth to N+2nd chambers for allowing the ion beam to pass through are arranged in predetermined places on a beam line of the ion implantation device in this order from an upper stream side, an n−1st gap intervenes between the n−1st chamber and the nth chamber, and an nth gap intervenes between the nth chamber and the n+1st chamber, the nth chamber is electrically insulated from the n−1st and n+1st chambers via the n−1st and nth gaps, and the two n−1st and nth gaps obliquely cross a standard axis of the ion beam at a predetermined angle in opposite directions, the nth chamber is connected to a scanning power source which applies an electric potential having desired scanning waveform.

However, N is a natural number, n is a natural number from 2 to N+1 which changes one by one.

An ion implantation device according to claim 5, which draws out desired ion species from an ion source for creating ions, accelerates or decelerates the ion species into desired energy and scans an implantation surface of a substrate with an ion beam so as to implant the ion beam thereinto, comprises a chamber divided type ion beam scanning mechanism constituted so that first, second and third chambers for allowing the ion beam to pass through are arranged in predetermined places on a beam line of the ion implantation device in this order from an upper stream side, a first gap intervenes between the first chamber and the second chamber, and a second gap intervenes between the second chamber and the third chamber, the second chamber is electrically insulated from the first and third chambers via the first and second gaps, and the two first and second gaps obliquely cross a standard axis of the ion beam at a predetermined angle in the same direction, the second chamber is connected to a scanning power source which applies an electric potential having desired scanning waveform.

An ion implantation device according to claim 6, which draws out desired ion species from an ion source for creating ions, accelerates or decelerates the ion species into desired energy and scans an implantation surface of a substrate with an ion beam so as to implant the ion beam thereinto, comprises a chamber divided type ion beam scanning mechanism constituted so that first to nth and nth to N+2nd chambers for allowing the ion beam to pass through are arranged in predetermined places on a beam line of the ion implantation device in this order from an upper stream side, an n−1st gap intervenes between the n−1st chamber and the nth chamber, and an nth gap intervenes between the nth chamber and the n+1st chamber, the nth chamber is electrically insulated from the n−1st and n+1st chambers via the n−1st and nth gaps, and the two n−1st and nth gaps obliquely cross a standard axis of the ion beam at a predetermined angle in the same direction, the nth chamber is connected to a scanning power source which applies an electric potential having desired scanning waveform.

However, N is a natural number, n is a natural number from 2 to N+1 which changes one by one.

An ion implantation device according to claim 7 is constituted so that a phase of the scanning waveform of the electric potential to be applied to the n+1st chamber is different by $\pi$ from that of the scanning waveform of the electric potential to be applied to the nth chamber.

However, in this case, N in claim 2 or 4 is a natural number of two or more.

The ion implantation device according to claim 8 is constituted so that a permanent magnet is arranged in at least one chamber composing the chamber divided type ion beam scanning mechanism so that magnetic flux perpendicularly crosses the surface to be scanned with the ion beam.

An ion implantation device according to claim 9, which draws out desired ion species from an ion source for creating ions, accelerates or decelerates the ion species into desired energy and scans an implantation surface of a substrate with an ion beam so as to implant the ion beam thereinto, comprises a chamber divided type ion beam scanning mechanism constituted so that a deflecting electric magnet for deflecting the ion beam is arranged on a beam line of the ion implantation device, first, second and third chambers for allowing the ion beam to pass through are arranged on the beam line near the deflecting electric magnet in this order from an upper stream side, the second chamber is arranged in a magnetic pole gap of the deflecting electric magnet, a first gap formed near an incident opening of the deflecting electric magnet for the ion beam intervenes between the first chamber and the second chamber, and a second gap formed near an output opening of the deflecting electric magnet for the ion beam intervenes between the second chamber and the third chamber, the second chamber is electrically insulated from the first and third chambers via the first and second gaps, the first gap near the incident opening of the deflecting electric magnet obliquely crosses a standard axis of the ion beam in an opposite direction to a deflection angle of the deflecting electric magnet, and the second gap near the output opening of the deflecting electric magnet obliquely crosses the standard axis of the ion beam in the same direction as the deflection angle of the deflecting electric magnet, the second chamber is connected to a scanning power source which applies an electric potential having desired scanning waveform.

An ion implantation device according to claim 10, which draws out desired ion species from an ion source for creating ions, accelerates or decelerates the ion species into desired energy and scans an implantation surface of a substrate with an ion beam so as to implant the ion beam thereinto, comprises a chamber divided type ion beam scanning mechanism constituted so that a deflecting electric magnet for deflecting the ion beam is arranged on a beam line of the ion implantation device, first, second and third chambers for allowing the ion beam to pass through are arranged on the beam line near the deflecting electric magnet in this order from an upper stream side, the second chamber is arranged in a magnetic pole gap of the deflecting electric magnet, a first gap formed near an incident opening of the deflecting electric magnet for the ion beam intervenes between the first chamber and the second chamber, and a second gap formed near an output opening of the deflecting electric magnet for the ion beam intervenes between the second chamber and the third chamber, the second chamber is electrically insulated from the first and third chambers via the first and second gaps, and the second gap near the output opening of the deflecting electric magnet obliquely crosses a standard axis of the ion beam in an opposite direction to a deflection angle of the deflecting electric magnet, the second chamber is connected to a scanning power source which applies an electric potential having desired scanning waveform.

An ion implantation device according to claim 11 is constituted so that electrodes are attached to respective end surfaces of the chambers forming the respective gaps, respectively.

An ion implantation device according to claim 12 is constituted so that an angle at which the respective gaps obliquely cross the standard axis of the ion beam is about 45°.

EFFECTS OF THE INVENTION

The ion implantation device of the present invention has the following excellent effects since the it has the above configuration.

(1) When the configuration of claim 1 is provided, diffusion of the ion beam due to a space-charge effect is suppressed, a scanning waveform can be finely controlled, and a large scanning angle can be obtained even with the ion beam having high electrostatic potential.

(2) When the configuration according to claim 2 is provided, besides the effect similar to that of claim 1, a scanning angle which is N times as large as that according to claim 1 can be obtained even with the ion beam having high electrostatic potential.

(3) When the configuration according to claim 3 is provided, besides the effect similar to that according to claim 1, a scanning angle which is two times as large as that according to claim 1 can be obtained even with the ion beam having high electrostatic potential.

(4) When the configuration according to claim 4 is provided, besides the effect similar to that according to claim 3, a scanning angle which is N times as large as that according to claim 3 can be obtained even with the ion beam having high electrostatic potential.

(5) When the configuration according to claim 5 is provided, the diffusion of the ion beam due to the space-charge effect is suppressed and the electric potential of the second chamber is modulated so that the inside can be scanned while parallelism of the ion beam is maintained.

(6) When the configuration according to claim 6 is provided, besides the effect similar to that according to claim 5, shift from the standard axis at an amount which is N times as large as that according to claim 5 is enabled even with the ion beam having high electrostatic potential.

(7) When the configuration according to claim 7 is provided, when the chamber is divided into a plural number of chambers, the scanning angle of the ion beam can be enlarged as much as possible.

(8) When the configuration according to claim 8 is provided, electrons are prevented from flowing from the inside of the chambers, and the diffusion of the ion beam due to the space-charge effect in the chambers can be suppressed.

(9) When the configuration according to claim 9 is provided, the diffusion of the ion beam due to the space-charge effect is suppressed, a scanning waveform can be finely controlled, so that the scanning angle which is about three times as large that in the other configurations can be obtained even with the ion beam having high electrostatic potential.

(10) When the configuration according to claim 10 is provided, the diffusion of the ion beam due to the space-charge effect is suppressed, the scanning waveform can be finely controlled, and even the ion beam having high electrostatic potential can be emitted parallel with the standard axis so as to be separated from the standard axis.

(11) When the configuration according to claim 11 is provided, a stable electric field can be formed at the gaps between the chambers.

(12) When the configuration according to claim 12 is provided, the scanning angle of the ion beam can be provided effectively at a maximum.

BEST MODE FOR CARRYING OUT THE INVENTION

First and second basic principles of an ion implantation device of the present invention, and first to seventh embodiments are sequentially explained below with reference to FIGS. 1 to 10 and 11.

Before the explanation about the ion implantation device according to the embodiments of the present invention, the first and second basic principles of the present invention which are common in the respective embodiments are explained with reference to FIGS. 1 and 2.

FIG. 1 is a plan view illustrating a configuration of a chamber divided type ion beam scanning mechanism for explaining the first basic principle of the present invention.

FIG. 2 is a plan view illustrating a configuration of the chamber divided type ion beam scanning mechanism for explaining the second basic principle of the present invention.

As to the configurations of the ion implantation device according to the first to seventh embodiments, mentioned later, the ion implantation device 100 shown in FIG. 11 has a chamber divided type ion beam scanning mechanism instead of the scanner 160, and the other parts of the configuration are the same as those in FIG. 11. For this reason, the chamber divided type ion beam scanning mechanism is mainly explained below, and the other parts of the configuration are not explained below.

The first basic principle of the ion beam scanning mechanism of the present invention is explained with reference to FIG. 1.

FIG. 1 illustrates an entire configuration of the ion beam scanning mechanism 10A for explaining the first basic principle of the present invention.

The basic configuration of the ion beam scanning mechanism 10A is such that in the ion implantation device, first, second and third chambers 12A, 14A and 16A are arranged in desired places of chambers through which an ion beam B is allowed to pass, a first gap 20A intervenes between the first chamber 12A and the second chamber 14A, and a second gap 22A intervenes between the second chamber 14A and the third chamber 16A.

The second chamber 14A is electrically insulated from the first chamber 12A and the third chamber 16A via two first and second electrode pairs 26A and 28A attached to end surfaces of the chambers 12A, 14A and 16A forming the first and second gaps 20A and 22A, respectively.

The first electrode pair 26A is composed of an electrode 30A attached to the end surface of the first chamber 12A, and an electrode 32A attached to the end surface of the second chamber 14A so as to be opposed to the electrode 30A via the first gap 20A.

Similarly, the second electrode pair 28A is composed of an electrode 34A attached to the end surface of the second chamber 14A, and an electrode 36A attached to the end surface of the third chamber 16A so as to be opposed to the electrode 34A via the second gap 22A.

As mentioned later, the electrodes 30A, 32A, 34A and 36A have rectangular openings through which the ion beam B can pass (see FIG. 3).

The two electrode pairs 26A and 28A attached to the first and second gaps 20A and 22A, respectively, obliquely cross a standard axis J of the ion beam B in opposite directions at a predetermined angle.

The standard axis J of the ion beam B is a center trajectory along which the ion beam B advances, and, namely, a design trajectory which is designed so that the ion beam B is implanted in the center of the substrate 180.

Further, to obliquely cross in the opposite directions means that, as shown in FIG. 1, a positional relationship between an obtuse angle and an acute angle in angles formed by the first and second electrode pairs 26A and 28A and the standard axis J is opposite.

As shown in FIG. 1, the first and third chambers 12A and 16A have ground potentials, and a predetermined potential is applied to the second chamber 14A by a power source 40A.

In the above configuration, the basic principle of the chamber divided type ion beam scanning mechanism 10A to be used in the ion implantation device of the present invention is explained.

As shown in FIG. 1, in the chamber divided type ion beam scanning mechanism 10A, the chambers 12A, 14A and 16A whose potentials are different are arranged via the two electrode pairs 26A and 28A which obliquely cross the standard axis J in the opposite directions.

The electrostatic potential of the ion beam B to enter along the standard axis J is designated by $\phi$, the first and third chambers 12A and 16A have the ground potentials, the potential of the second chamber 14A is designated $-V$, an angle formed by the first electrode pair 26A and the standard axis J is designated by $\theta + \pi/2$.

In this case, since the electric field between the electrodes 30A and 32A has an angle $\theta$ with respect to the standard axis J, the ion B which passes therethrough receives an oblique impulse with respect to the standard axis J.

As a result, an deflection angle $\delta\theta$ of the ion beam B to pass therethrough is expressed by the following expression (2) when an absolute value of the electric potential V of the second chamber 14A is sufficiently smaller than the electrostatic potential $\phi$ of the ion beam B:

[Expression 2]

$$\delta\theta \cong -\frac{V}{2\phi}\tan\theta \quad (2)$$

Similarly, when an angle formed by the second electrode pair 28A and the standard axis J is designated by $\pi/2 - \theta$, the electric field between the electrodes 34A and 36A has an angle $\pi - \theta$ with respect to the standard axis J. For this reason, the ion beam B which passes therethrough again receives an oblique impulse with respect to the standard axis J.

As a result, the ion beam B which passes the second electrode pair 28A is further deflected by $\delta\theta$.

Since the third chambers 12A and 16A have the ground potentials, the ion beam B which has passes through the two electrode pairs 26A and 28A has the electrostatic potential $\phi$ similarly to the case before incidence, but its angle with respect to the standard axis J is $2\delta\theta$.

For example, when the electrostatic potential $\phi$ is 200 kV, the applied voltage V is 20 kV, and the angle $\theta$ with respect to the standard axis J is 45°, the deflection angle is 5.5°.

Further, in the ion beam scanning mechanism 10A, when the ion beam B passes, the electrostatic field is present only between the electrodes 30A and 32A of the first electrode pair 26A and between the electrodes 34A and 36A of the second electrode pair 28A. The diffusion of the beam B due to the space-charge effect is very small.

Therefore, the chamber divided type ion beam scanning mechanism 10A having the first basic principle of the present invention suppresses the diffusion of the ion beam due to the space-charge effect, and can obtain a large scanning angle even in the case of the ion beam having high electrostatic potential.

The second principle of the ion beam scanning mechanism of the present invention is explained below with reference to FIG. 2.

FIG. 2 illustrates an entire configuration of the ion beam scanning mechanism 10B for explaining the second basic principle of the present invention.

In the basic configuration of the ion beam scanning mechanism 10B, similarly to the explanation about the first basic principle, the first, second and third chambers 12B, 14B and 16B are arranged in desired places of the chambers for allowing the ion beam B to pass through, the first gap 20B intervenes between the first chamber 12B and the second chamber 14B, and the second gap 22B intervenes between the second chamber 14B and the third chamber 16B.

The second chamber 14B is electrically insulated from the first chamber 12B and the third chamber 16B via the first and second electrode pairs 26B and 28B attached to the end surfaces of the chambers 12B, 14B and 16B forming the first and second gaps 20B and 22B, respectively.

The first electrode pair 26B is composed of electrodes 30B and 32B, and the second electrode pair 28B is composed of electrodes 34B and 36B.

The two electrode pairs 26B and 28B attached to the first and second gaps 20B and 22B obliquely cross the standard axis J of the ion beam B in the same direction at a predetermined angle.

To obliquely cross in the same direction means that, as shown in FIG. 2, a positional relationship between an obtuse angle and an actuate angle formed by the first and second electrode pairs 26B and 28B and the standard axis J is the same direction.

As shown in FIG. 2, the first and third chambers 12B and 16B have the ground potentials, and a predetermined electric potential is applied to the second chamber 14B by the power source 40B.

In this configuration, as shown in FIG. 2, when the first and second electrode pairs 26B and 28B obliquely cross the standard axis J parallel at the same angle $\pi/2 + \theta$ and a distance from the first electrode pair 26B to the second electrode pair 28B is designated by L, the ion beam B which has passed this region is parallel with the standard axis J and moves from the standard axis J only by L×$\delta\theta$.

In the ion beam scanning mechanism 10B explained in the second basic principle, when the electric potential of the second chamber 14B is modulated, therefore, the scanning can be carried out in a certain plane by modulating the electric potential of the second chamber 14B while the parallelism of the ion beam is maintained.

First Embodiment

The chamber divided type ion beam scanning mechanism according to the first embodiment to be used in the ion implantation device of the present invention is explained below with reference to FIGS. 3 and 4.

FIG. 3 is an appearance perspective view illustrating a configuration of the chamber divided type ion beam scanning mechanism 10C to be used in the ion implantation device according to the first embodiment of the present invention.

FIG. 4 is a plan view explaining the basic configuration and the basic operation of the chamber divided type ion beam scanning mechanism 10C to be used in the ion implantation device according to the first embodiment of the present invention.

In the explanations about first to sixth embodiments, only the standard axis of the ion beam is illustrated, and the actual trajectory of the ion beam is omitted.

In the basic configuration of the ion beam scanning mechanism 10C of this embodiment, as shown in FIGS. 3 and 4, the first, second and third chambers 12C, 14C and 16C are arranged in desired places of the chambers for allowing the ion beam to pass, the first gap 20C intervenes between the first chamber 12C and the second chamber 14C, and the second gap 22C intervenes between the second chamber 14C and the third chamber 16C.

The second chamber 14C is electrically insulated from the first chamber 12C and the third chamber 16C via the first and second electrode pairs 26C and 28C attached to the end surfaces of the chambers 12C, 14C and 16C forming the first and second gaps 20C and 22C, respectively.

The first electrode pair 26C is composed of electrodes 30C and 32C, and the second electrode pair 28C is composed of electrodes 34C and 36C.

As shown in FIG. 3, the electrodes 30C, 32C 34C and 36C have rectangular openings through which the ion beam can pass, and since this is similarly applied to the following embodiments, any comment is not particularly given.

Further, any one of the two electrode pairs 26C and 28C attached to the first and second gaps 20C and 22C, respectively, obliquely crosses the standard axis J of the ion beam at a predetermined angle $\pi/2+\theta$.

FIGS. 3 and 4 illustrate the case where the first electrode pair 26C obliquely crosses the standard axis J.

The first and third chambers 12C and 16C have the ground potentials, and the second chamber 14C is connected to a scanning power source 40C which applies an electric potential having a desired scanning waveform.

In the ion beam scanning mechanism 10C of this embodiment, since the first electrode pair 26C has an angle of $\pi/2+\theta$ with respect to the standard axis J, when an electric potential having desired triangular wave is applied to the second chamber 14C by the scanning power source 40C, the scanning with the ion beam is carried out at an angle proportional to the electric potential with respect to the standard axis J.

Therefore, the chamber divided type ion beam scanning mechanism 10C to be used in the ion implantation device according to the first embodiment of the present invention suppresses the diffusion of the ion beam due to the space-charge effect, can finely control a scanning waveform, and can obtain the large scanning angle even with the ion beam having high electrostatic potential.

Second Embodiment

The chamber divided type ion beam scanning mechanism to be used in the ion implantation device according to the second embodiment of the present invention is explained below with reference to FIG. 5.

FIG. 5 is a plan view illustrating the configuration of the chamber divided type ion beam scanning mechanism 10D to be used in the ion implantation device according to the second embodiment of the present invention.

In the basic configuration of the ion beam scanning mechanism 10D in this embodiment, as shown in FIG. 5, the first, second and third chambers 12D, 14D and 16D are arranged in desired places of the chamber for allowing the ion beam to pass through, the first gap 20D intervenes between the first chamber 12D and the second chamber 14D, and the second gap 22D intervenes between the second chamber 14D and the third chamber 16D.

The second chamber 14D is electrically insulated from the first chamber 12D and the third chamber 16D via the first and second electrode pairs 26B and 28D attached to the end surfaces of the chambers 12D, 14D and 16D forming the first and second gaps 20D and 22D.

The first electrode pair 26D is composed of electrodes 30D and 32D, and the second electrode pair 28D is composed of electrodes 34D and 36D.

The two electrode pairs 26D and 28D attached to the first and second gaps 20D and 22D, respectively, obliquely cross the standard axis J of the ion beam in opposite directions at a predetermined angle.

Further, the first and third chambers 12D and 16D have the ground potential, and the second chamber 14D is connected to the scanning power source 40D which applies an electric potential having desired scanning waveform.

In the ion beam scanning mechanism 10D of this embodiment, the angle formed by the first electrode pair 26D and the standard axis J is designated by $\pi/2+\theta$, and the angle formed by the second electrode pair 28D and the standard axis J is designated by $\pi/2-\theta$. The electric potential of the second chamber 14D electrically insulated is applied by the scanning power source 40D, so that the scanning with the ion beam is carried out at an angle which is twice as large as that of the ion beam scanning mechanism 10C in the first embodiment.

That is to say, according to the second embodiment, the effect similar to that of the first embodiment is produced, and the scanning angle of the ion beam can be further increased.

Third Embodiment

The chamber divided type ion beam scanning mechanism to be used in the ion implantation device according to a third embodiment of the present invention is explained below with reference to FIG. 6.

FIG. 6 is a plan view explaining the basic configuration and the basic operation of the chamber divided type ion beam scanning mechanism 10E to be used in the ion implantation device according to the third embodiment of the present invention.

In the basic configuration of the ion beam scanning mechanism 10E of the third embodiment, as shown in FIG. 6, the first, second, third and fourth chambers 12E, 14E, 16E and 18E are arranged in desired places of the chamber for allowing the ion beam B to pass through, the first gap 20E intervenes between the first chamber 12E and the second chamber 14E, and the second gap 22E intervenes between the second chamber 14E and the third chamber 16E.

The second gap 22E intervenes between the second chamber 14E and the third chamber 16E, and a third gap 24E intervenes between the third chamber 16E and the fourth chamber 18E.

The second chamber 14E is electrically insulated from the first chamber 12E and the third chamber 16E via the first and second electrode pairs 26E and 28E attached to the end surfaces of the chambers 12E and 14E and 16E forming the first and second gaps 20E and 22E.

Further, the third chamber 16E is electrically insulated from the second chamber 14E and the fourth chamber 18E via the second and third electrode pairs 28E and 29E attached to the end surfaces of the chambers 14E, 16E and 18E forming the second and third gaps 22E and 24E.

The first electrode pair 26E is composed of electrodes 30E and 32E, the second electrode pair 28E is composed of electrodes 34E and 36E, and the third electrode pair 29E is composed of the electrodes 37E and 38E.

Further, the three electrode pairs 26E, 28E and 29E attached to the first to third gaps 20E, 22E and 24E, respectively, obliquely cross the standard axis J of the ion beam in the opposite directions at a predetermined angle.

Further, the first and fourth chambers 12E and 18E have the ground potential, and the second and third chambers 14E and 16E are connected to the scanning power sources 40E and 42E which apply an electric potential having desired scanning waveform, respectively.

In the ion beam scanning mechanism 10E of the third embodiment, an angle formed by the first electrode pair 26E and the standard axis J is designated by $\pi/2+\theta$, an angle formed by the second electrode pair 28E and the standard axis J is designated by $\pi/2-\theta$, and an angle formed by the third electrode pair 29E and the standard axis J is designated by $\pi/2+\theta$.

The electric potentials of the second and third chambers 14E and 16E electrically insulated are applied by the scanning power sources 40E and 42E, respectively, but at this time, when triangular waves having scanning waveforms different whose phases are different by $\pi$ are applied to the scanning power sources 40E and 42E, the scanning with the ion beam is carried out at an angle which is twice as large as that of the ion beam scanning mechanism 10D in the second embodiment.

According to the similar method, three or more chambers whose electric potentials are modulated by the scanning power sources may be arranged.

In this case, it is desirable that triangular waves whose phases are different by $\pi$ are applied to the odd-numbered chambers and the even-numbered chambers.

When the number of the chambers whose potential is modulated is N, the scanning with the ion beam is carried out at an angle which is Nth time as large as that of the ion beam scanning mechanism 10D in the second embodiment.

Fourth Embodiment

The chamber divided type ion beam scanning mechanism to be used in the ion implantation device according to a fourth embodiment of the present invention is explained below with reference to FIG. 7.

FIG. 7 is a plan view illustrating the configuration of the chamber divided type ion beam scanning mechanism 10F to be used in the ion implantation device according to the fourth embodiment of the present invention.

In the basic configuration of the ion beam scanning mechanism 10F of the fourth embodiment, as shown in FIG. 7, the first, second and third chambers 12F, 14F and 16F are arranged in desired places of the chambers for allowing the ion beam to pass, the first gap 20F intervenes between the first chamber 12F and the second chamber 14F, and the second gap 22F intervenes between the second chamber 14F and the third chamber 16F.

The second chamber 14F is electrically insulated from the first chamber 12F and the third chamber 16F via the first and second electrode pairs 26F and 28F attached to the end surfaces of the chambers 12F, 14F and 16F forming the first and second gaps 20F and 22F.

The first electrode pair 26F is composed of electrodes 30F and 32F, and the second electrode pair 28F is composed of electrodes 34F and 36F.

Further, the two electrode pairs 26F and 28F attached to the first and second gaps 20F and 22F, respectively, obliquely cross the standard axis J of the ion beam in the same direction at a predetermined angle of $\pi/2+\theta$.

Further, the first and third chambers 12F and 16F have the ground potentials, and the second chamber 14F is connected to the scanning power source 40F which applies an electric potential having desired scanning waveform.

In the ion beam scanning mechanism 10F of the fourth embodiment, angles formed by the first and second electrode pairs 26F and 28F and the standard axis J are parallel with $\pi/2+\theta$, and a rectangular wave having desired scanning waveform is applied to the second chamber 14F by the scanning power source 40F. As a result, while the angle of the ion beam with respect to the standard axis J is maintained constant, the scanning is carried out with ion beam shifting from the standard axis J according to the second basic principle shown in FIG. 2.

Fifth Embodiment

The chamber divided type ion beam scanning mechanism to be used in the ion implantation device according to a fifth embodiment of the present invention is explained below with reference to FIG. 8.

FIG. 8 is a vertically side view illustrating the configuration of the chamber divided type ion beam scanning mechanism 10 to be used in the ion implantation device according to the fifth embodiment of the present invention.

In the basic configuration of the ion beam scanning mechanism 10 in the fifth embodiment, as shown in FIG. 8, a permanent magnet 50 is provided to the vicinities of the gaps 20 and 22 of the chambers 12, 14 and 16 composing the ion beam scanning mechanisms 10C to 10F so that magnetic flux perpendicularly crosses the surface which is scanned with the ion beam B in the first to fourth ion beam scanning mechanism 10C to 10F.

This magnetic field prevents electrons from flowing from the insides of the chambers 12, 14 and 16, and can suppress the diffusion of the ion beam due to the space-charge effect in the chambers 12, 14 and 16.

Since the ion beam is slightly deflected by the magnetic field generated by the permanent magnet 50, it is desirable that the odd-number of the permanent magnets 50 are arranged so that N and S poles are arranged alternatively.

Sixth Embodiment

The chamber divided type ion beam scanning mechanism to be used in the ion implantation device according to a sixth embodiment of the present invention is explained below with reference to FIG. 9.

FIG. 9 is a plan view illustrating the configuration of the chamber divided type ion beam scanning mechanism 10G to be used in the ion implantation device according to the sixth embodiment of the present invention.

In the basic configuration of the ion beam scanning mechanism 10G in the sixth embodiment, as shown in FIG. 9, a deflecting electric magnet 60 which deflects the ion beam is arranged on a beam line of the ion implantation device, the first, second and third chambers 12G, 14G and 16G which allow the ion beam to pass through are arranged in the vicinity of the deflecting electric magnet 60 in this order from the upper stream side.

The second chamber 14G is arranged in a magnetic pole gap of the deflecting electric magnet 60, the first gap 20G formed in the vicinity of the deflecting electric magnet 60 on the incident side intervenes between the first chamber 12G and the second chamber 14G, and the second gap 22G formed in the vicinity of the deflecting electric magnet 60 on the output side intervenes between the second chamber 14G and the third chamber 16G.

Further, the second chamber 14G is electrically insulated from the first and third chambers 12G and 16G via the first and second electrode pairs 26G and 28G attached to the end surfaces of the chambers 12G, 14G and 16G forming the first and second gaps 20G and 22G, respectively.

The first electrode pair 26G is composed of electrodes 30G and 32G, and the second electrode pair 28G is composed of electrodes 34G and 36G.

Further, the first electrode pair 26G attached to the first gap 20G near the incident opening of the deflecting electric magnet 60 obliquely crosses the standard axis J of the ion beam in opposite directions at a predetermined angle of $\pi/2-\theta$ with respect to the deflection angle $\chi$ of the deflecting electric magnet 60.

Further, the second electrode pair 28G attached to the second gap 22G near the output opening of the deflecting electric magnet 60 obliquely crosses the standard axis J of the ion beam in the same direction at a predetermined angle $\pi/2-\theta$ with respect to the deflection angle $\chi$ of the deflecting electric magnet 60.

As shown by an arrow in FIG. 9, when the direction of the deflection angle $\chi$ is a negative direction and $\theta$ is a positive direction, the first electrode pair 26G obliquely crosses the standard axis J in the opposite direction to that of the deflection angle $\chi$, and the second electrode pair 28G obliquely crosses the standard axis J in the same direction as that of the deflection angle $\chi$.

Further, the second chamber 14G is connected to the scanning power source 40G which applies an electric potential having desired scanning waveform.

In the above configuration, a triangular wave having desired scanning waveform is applied to the second chamber 14G by the scanning power source 40G, so that the inside of the deflecting surface is scanned with the ion beam.

When the oblique output angle of the deflecting electric magnet 60 is designated by β as shown in FIG. 9, the deflection angle δθ of the ion beam is expressed by the following expression (3):

[Expression 3]

$$\delta\theta = -\frac{v}{2\varphi}[\tan\beta(1-\cos\chi) - \sin\chi + 2\tan\theta] \quad (3)$$

As is clear from the comparison with the expression (1), when the oblique cross angle θ of the first and second electrode pairs 26G and 28G is set to about 45°, even if a ratio of the scanning voltage V to the electrostatic potential φ of the entering ions is the same as that in the conventional configurations, the deflection angle δθ of the ion beam can be about three times as large as that in the conventional configuration.

Seventh Embodiment

The chamber divided type ion beam scanning mechanism to be used in the ion implantation device according to a seventh embodiment of the present invention is explained below with respect to FIG. 10.

FIG. 10 is a plan view illustrating the configuration of the chamber divided type ion beam scanning mechanism 10H to be used in the ion implantation device according to the seventh embodiment of the present invention.

In the basic configuration of the ion beam scanning mechanism 10H in the seventh embodiment, as shown in FIG. 10, the deflecting electric magnet 60 which deflects the ion beam B is arranged on the beam line of the ion implantation device, and the first, second and third chambers 12H, 14H and 16H which allow the ion beam B to pass through are arranged near the deflecting electric magnet 60 in this order from the upper stream side.

The second chamber 14H is arranged in a magnetic pole gap of the deflecting electric magnet 60, the first gap 20H formed near the incident opening of the deflecting electric magnet 60 for the ion beam B intervenes between the first chamber 12H and the second chamber 14H, and the second gap 22H formed near the output opening of the deflecting electric magnet 60 for the ion beam B intervenes between the second chamber 14H and the third chamber 16H.

Further, the second chamber 14H is electrically insulated from the first and third chambers 12H and 16H via the first and second electrode pairs 26H and 28H attached to the end surfaces of the chambers 12H, 14H and 16H forming the first and second gaps 20H and 22H.

The first electrode pair 26H is composed of electrodes 30H and 32H, and the second electrode pair 28H is composed of electrodes 34H and 36H.

Further, the second electrode pair 28G attached to the second gap 22G near the output opening of the deflecting electric magnet 60 obliquely crosses the standard axis J of the ion beam B in opposite directions at a predetermined angle of $\pi/2-\theta$ with respect to the deflection angle $\chi$ of the deflecting electric magnet 60.

Further, the second chamber 14H is connected to the scanning power source 40H which applies the electric potential having desired scanning waveform.

As shown in FIG. 10, a turning radius of the standard axis J of the ion beam B inside the deflecting electric magnet 60 is designated by R.

FIG. 10 shows the case where the deflection angle $\chi$ of the deflecting electric magnet 60 and the tilt angle θ of the second electrode pair 28H has negative values.

The oblique output angle of the deflecting electric magnet 60 is designated by β similarly to FIG. 9, and the first electrode pair 26H on the entrance side of the deflecting electric magnet 60 crosses the standard axis J perpendicularly for simple configuration.

At this time, the deflection angle δθ of the ion beam B after passing through the second electrode pair 28H on the output opening side of the deflecting electric magnet 60 is expressed by the following expression (4), and a shift X from the standard axis J is expressed by the following expression (5):

[Expression 4]

$$\delta\theta = -\frac{v}{2\varphi}[\tan\beta(1-\cos\chi) - \sin\chi + \tan\theta] \quad (4)$$

-continued

[Expression 5]

$$X = -R\frac{V}{2\phi}\sin\chi \quad (5)$$

When the oblique output angle β of the deflecting electric magnet 60, the deflection angle χ of the deflecting electric magnet 60 and the tilt angle θ of the second electrode 28H are selected so that a portion in angled bracket becomes zero, the ion beam B after passing through the second electrode pair 28H on the output opening side of the deflecting electric magnet 60 comes out parallel with the standard axis J and with a distance proportional to the scanning voltage V without depending on the scanning voltage V.

For example, when the deflection angle χ is 90°, the tilt angle θ is 45° and the oblique output angle β is 0°, the above conditions are satisfied.

The scanner of the ion implantation device of the present invention is not limited to the above embodiments, and thus various changes can be made.

The above embodiments explain the case where the three chambers are arranged, but in general needless to say, the present invention includes the cases where a lot of chambers are arranged and many tiers of the chambers connected to the scanning power source are arranged.

Further, the above embodiments explain the case where the electrodes are attached to the end surfaces of the gaps of the chambers, but the present invention includes the case where no electrode is attached to the chambers.

Furthermore, the example of the ion implantation device having the configuration shown in FIG. 11 is explained but it goes without saying that the present invention can be applied to all devices where a substrate is scanned with the ion beam and the ion beam is implanted thereinto.

DESCRIPTION OF REFERENCE SYMBOLS

Figure 1:
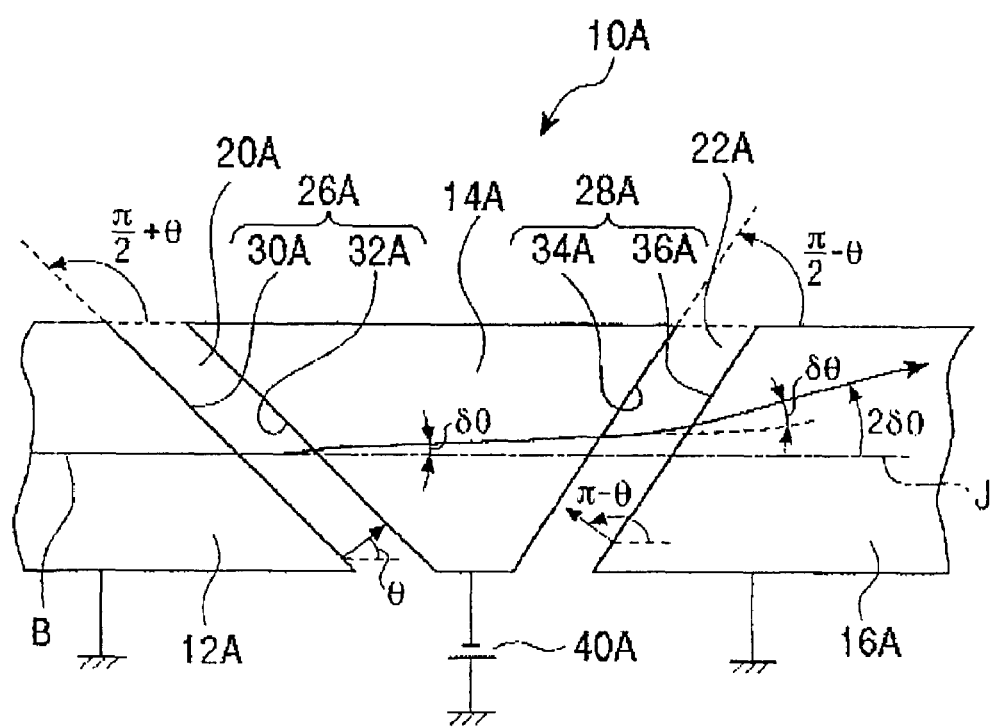
FIG. 1 is a plan view illustrating a configuration of a chamber divided type ion beam scanning mechanism for explaining a first basic principle of the present invention.
Figure 2:
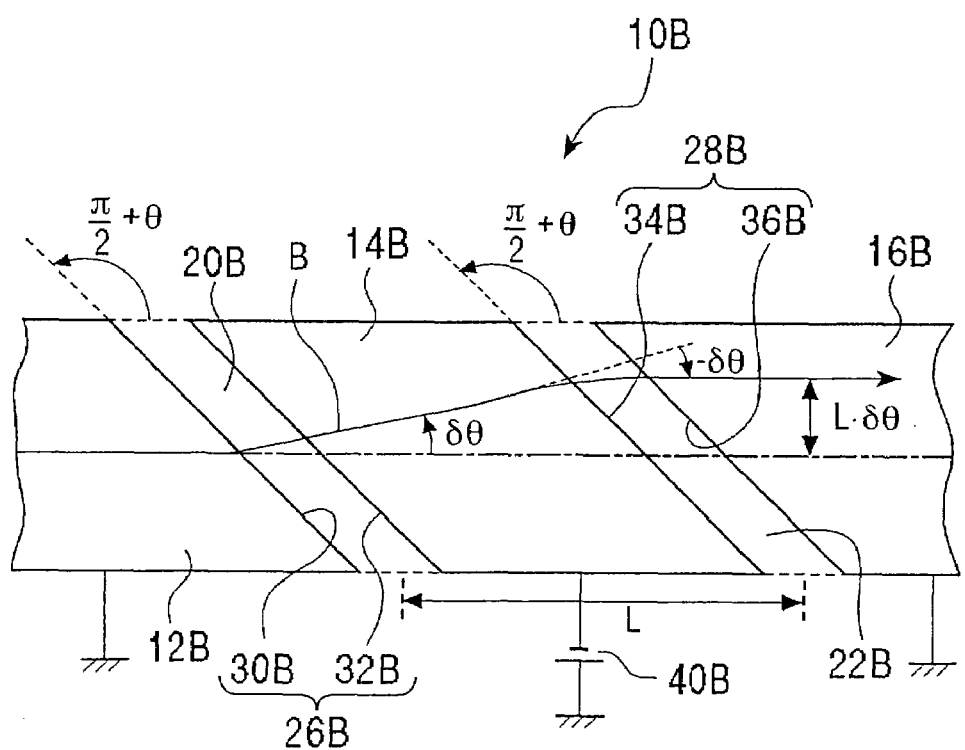
FIG. 2 is a plan view illustrating the configuration of the chamber divided type ion beam scanning mechanism for explaining a second basic principle of the present invention.
Figure 3:
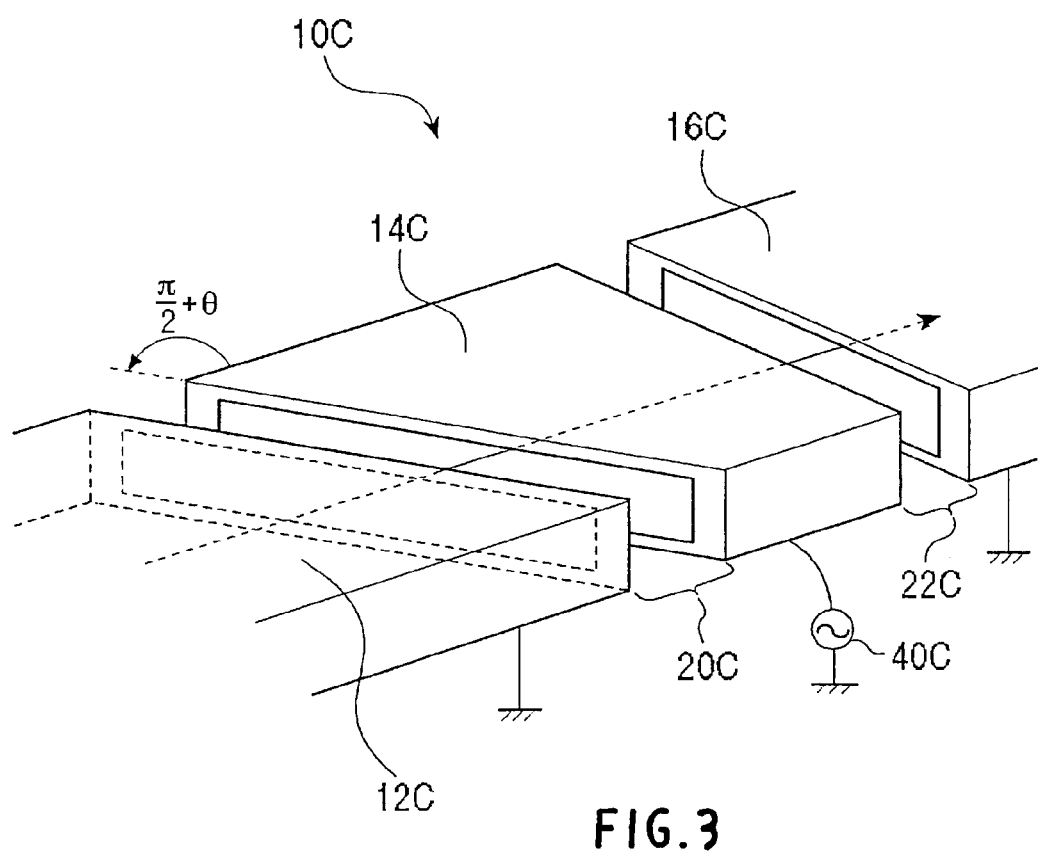
FIG. 3 is an appearance perspective view illustrating the configuration of the chamber divided type ion beam scanning mechanism to be used in an ion implantation device according to a first embodiment of the present invention.
Figure 4:
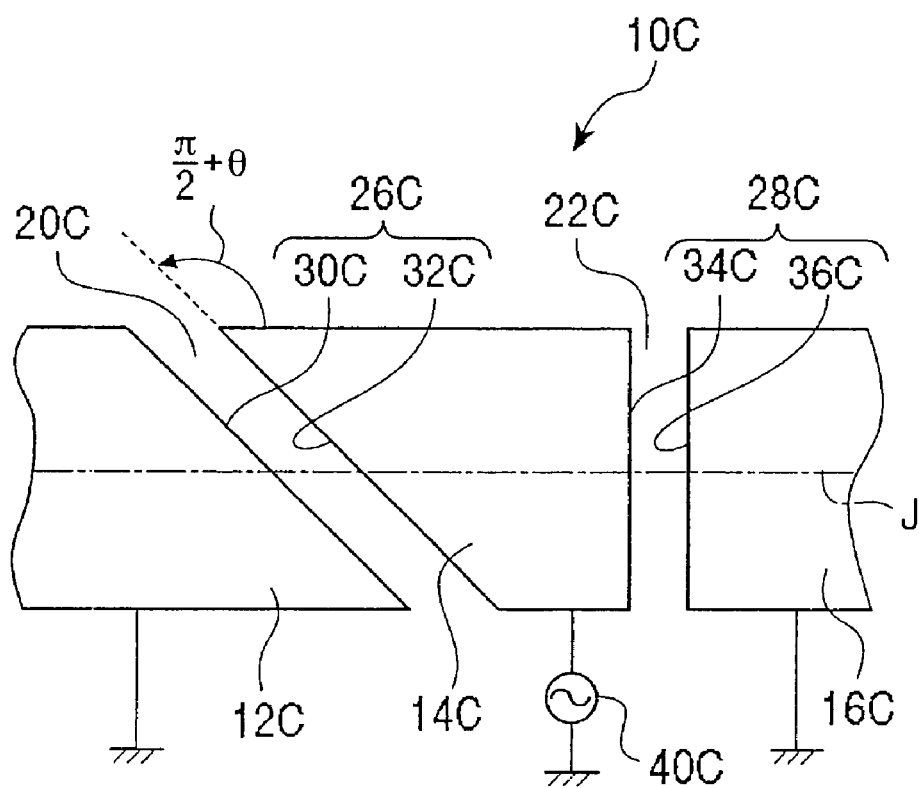
FIG. 4 is a plan view explaining a basic configuration and a basic operation of the chamber divided type ion beam scanning mechanism to be used in the ion implantation device according to the first embodiment of the present invention.
Figure 5:
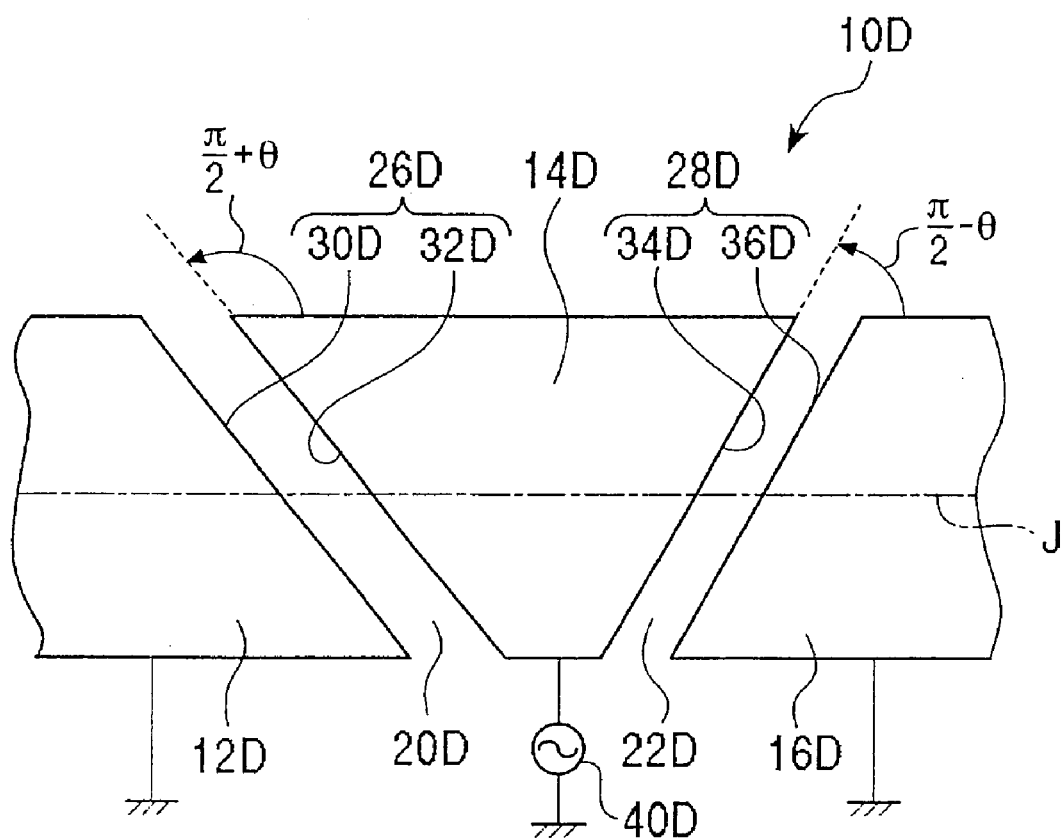
FIG. 5 is a plan view explaining the basic configuration and the basic operation of the chamber divided type ion beam scanning mechanism to be used in the ion implantation device according to a second embodiment of the present invention.
Figure 6:
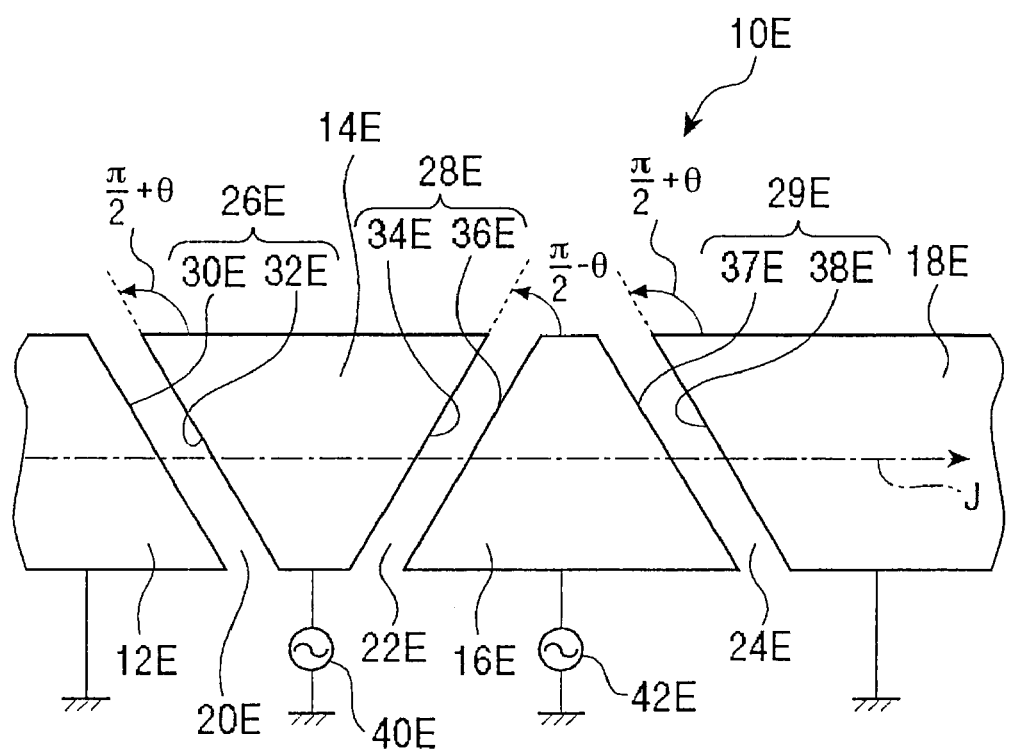
FIG. 6 is a plan view explaining the basic configuration and the basic operation of the chamber divided type ion beam scanning mechanism to be used in the ion implantation device according to a third embodiment of the present invention.
Figure 7:
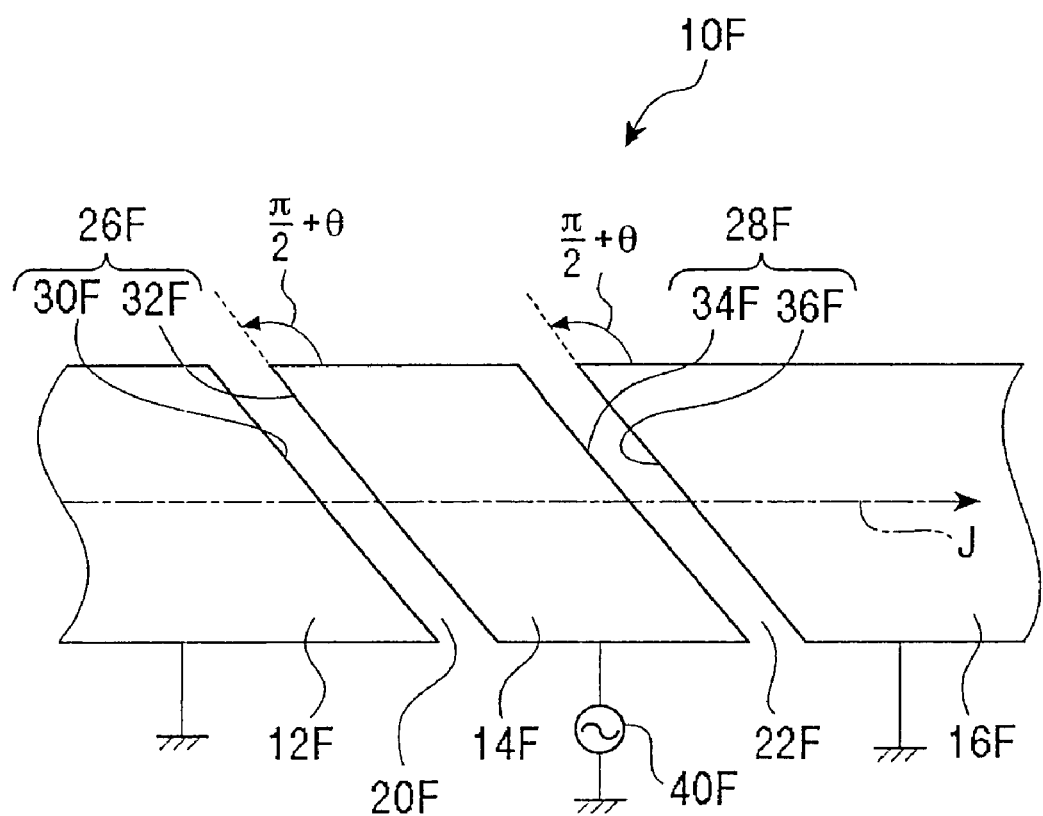
FIG. 7 is a plan view explaining the basic configuration and the basic operation of the chamber divided type ion beam scanning mechanism to be used in the ion implantation device according to a fourth embodiment of the present invention.
Figure 8:
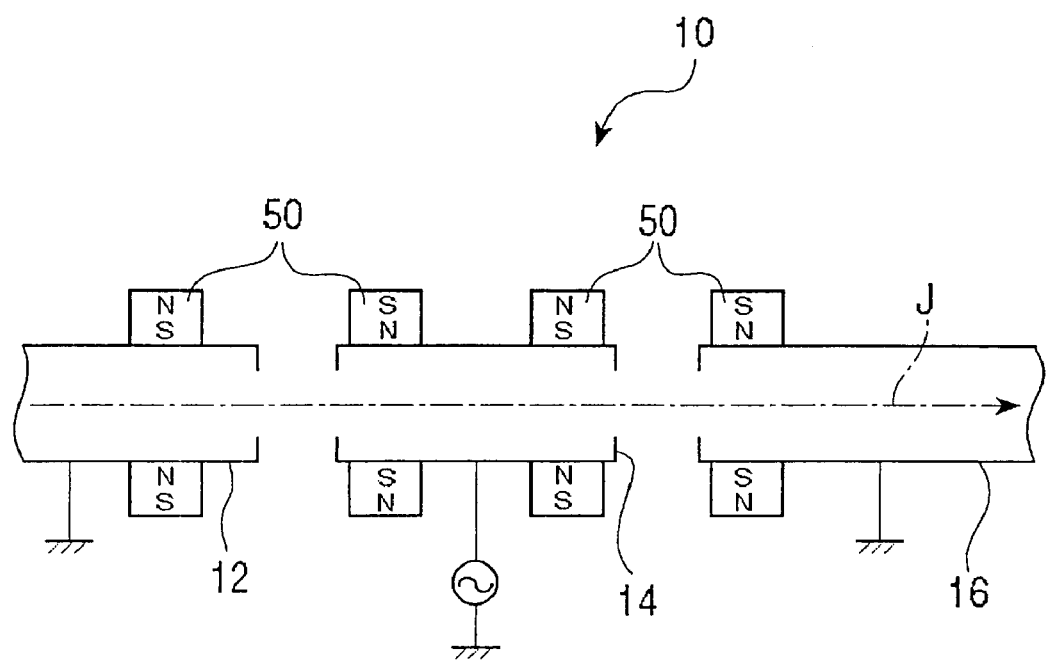
FIG. 8 is a plan view explaining the basic configuration and the basic operation of the chamber divided type ion beam scanning mechanism to be used in the ion implantation device according to a fifth embodiment of the present invention.
Figure 9:
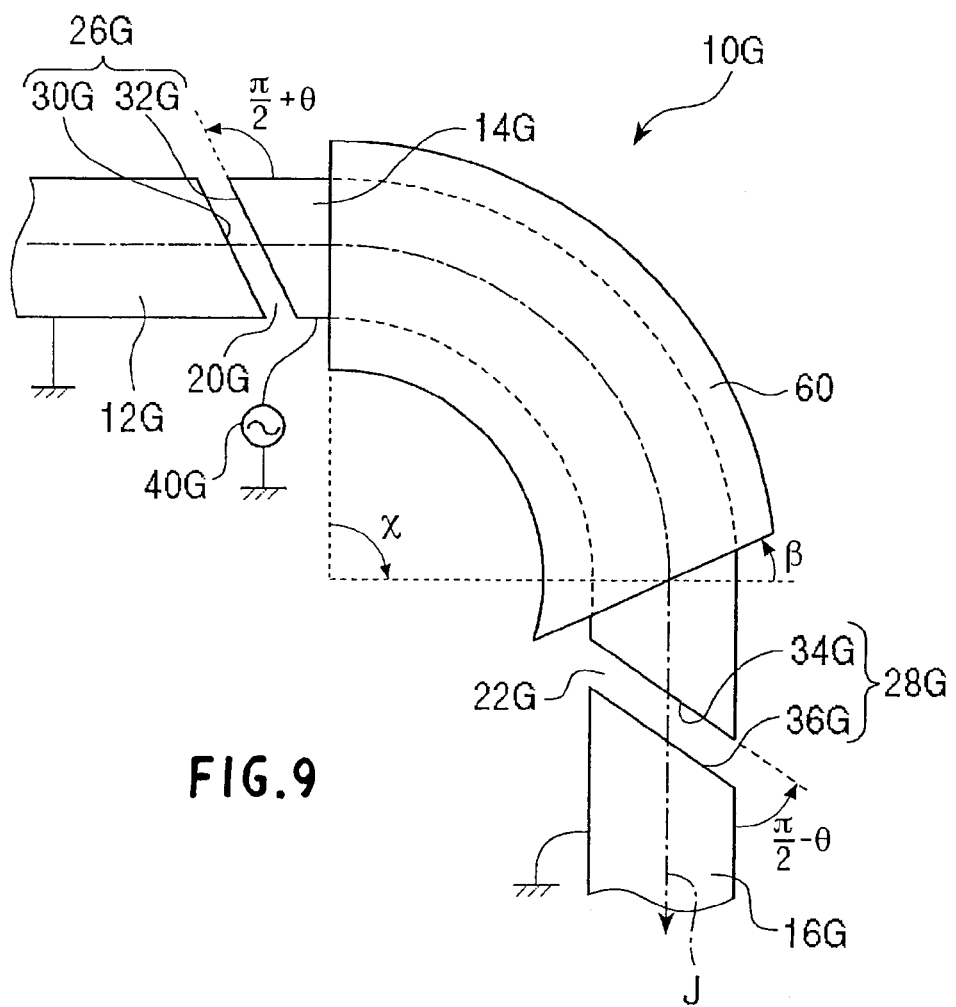
FIG. 9 is a plan view explaining the basic configuration and the basic operation of the chamber divided type ion beam scanning mechanism to be used in the ion implantation device according to a sixth embodiment of the present invention.
Figure 10:
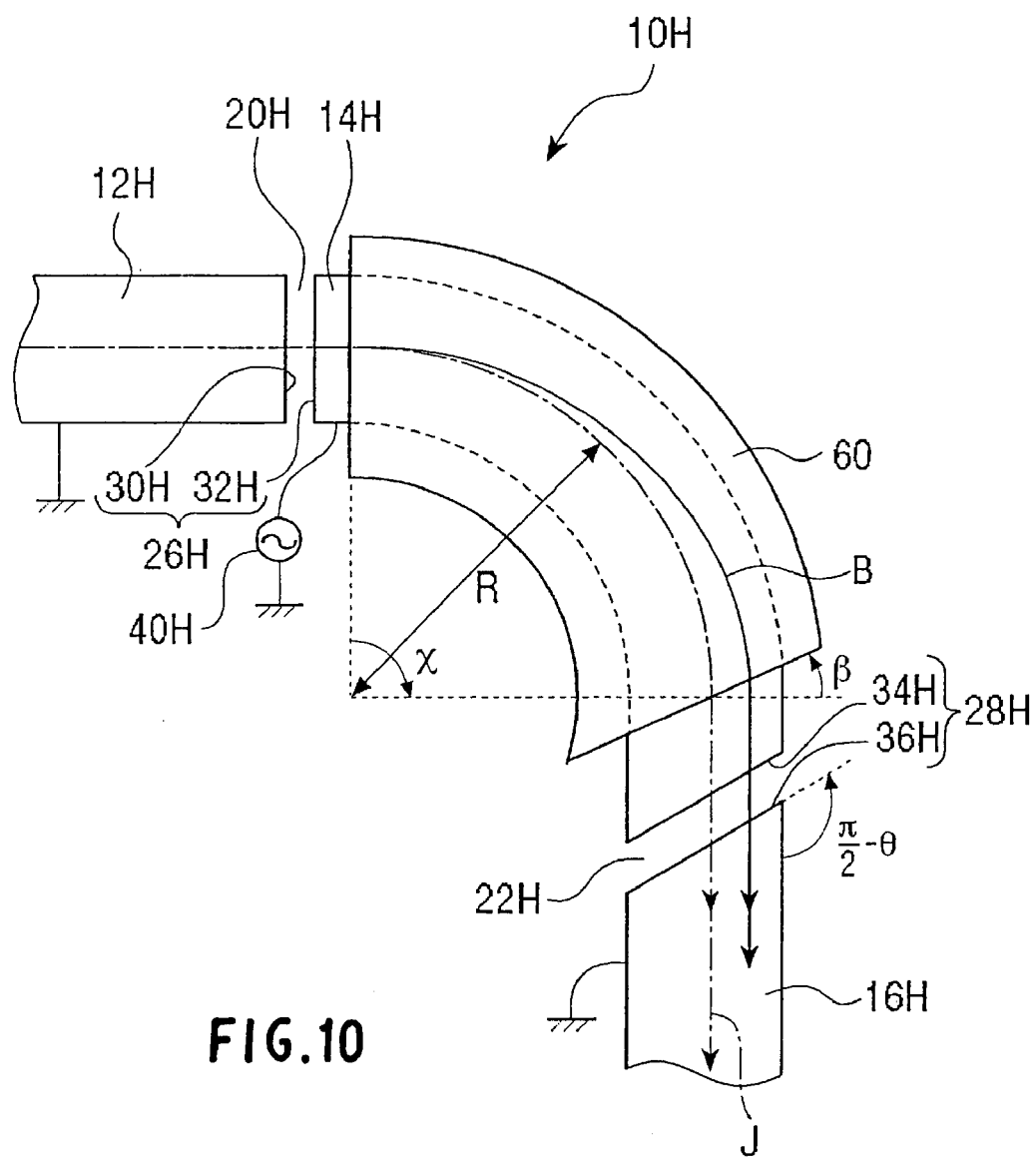
FIG. 10 is a plan view explaining the basic configuration and the basic operation of the chamber divided type ion beam scanning mechanism to be used in the ion implantation device according to a seventh embodiment of the present invention.
Figure 11:
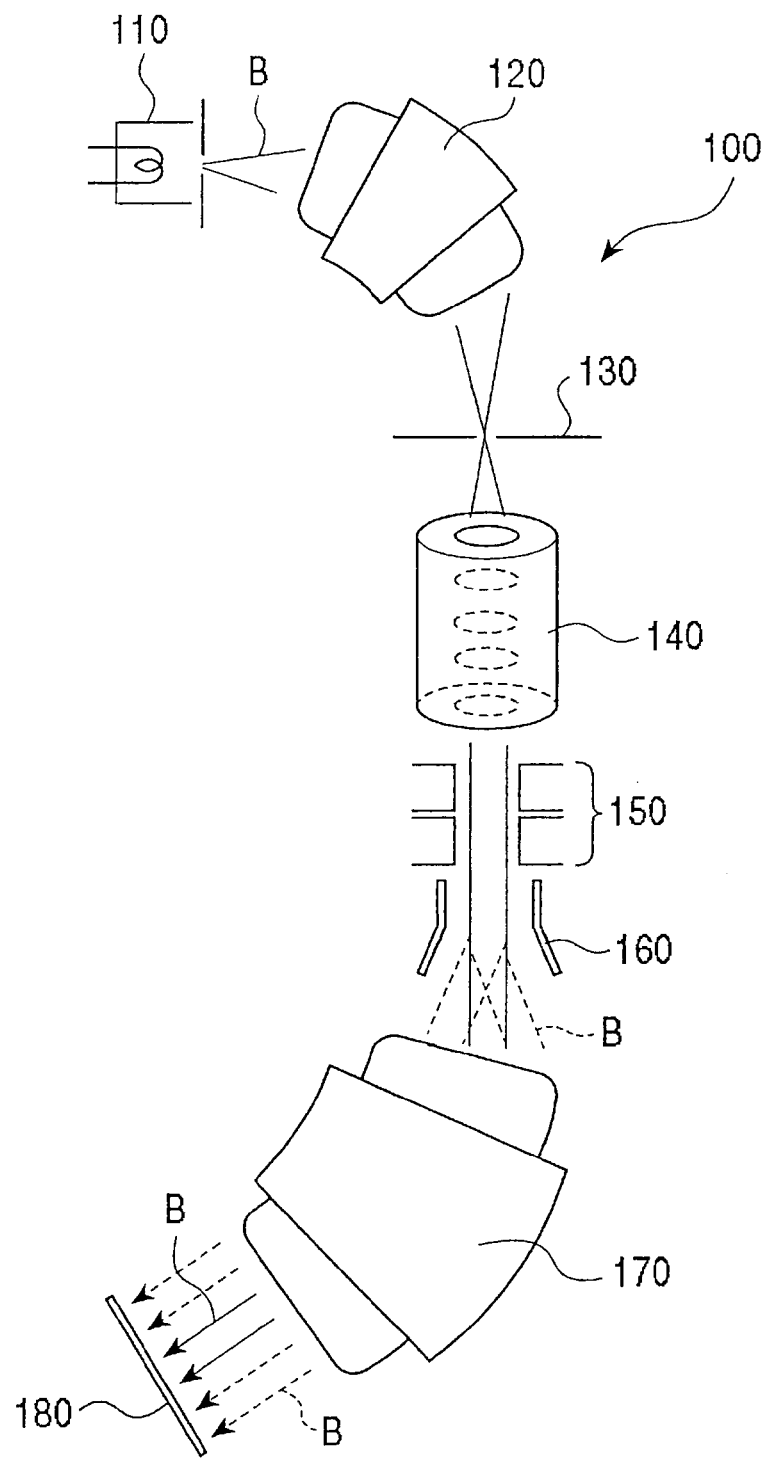
FIG. 11 is a plan view illustrating a schematic configuration of a conventional ion implantation device.

10, 10A TO 10H: ion beam scanning mechanism
12, 12A to 12H: first chamber
14, 14A to 14H: second chamber
16, 16A to 16H: third chamber
18E: fourth chamber
20A to 20H: first gap
22A to 22H: second gap
24E: third gap
26A to 26H: first electrode pair
28A to 28H: second electrode pair
29E: third electrode pair
30A to 30H: electrode
32A to 32H: electrode
34A to 34H: electrode
36A to 36H: electrode
37E, 38E: electrode
100: ion implantation device
B: ion beam
J: standard axis

The invention claimed is:

1. An ion implantation device which draws out desired ion species from an ion source for creating ions, accelerates or decelerates the ion species into desired energy and scans an implantation surface of a substrate with an ion beam so as to implant the ion beam thereinto, the ion implantation device comprising:
a chamber divided type ion beam scanning mechanism constituted so that:
first, second and third chambers for allowing the ion beam to pass through are arranged in predetermined places on a beam line of the ion implantation device in this order from an upper stream side,
a first gap intervenes between the first chamber and the second chamber, and a second gap intervenes between the second chamber and the third chamber,
the second chamber is electrically insulated from the first and third chambers via the first and second gaps, and any one of the first and second gaps obliquely crosses a standard axis of the ion beam at a predetermined angle,
the second chamber is connected to a scanning power source which applies an electric potential having desired scanning waveform.

2. An ion implantation device which draws out desired ion species from an ion source for creating ions, accelerates or decelerates the ion species into desired energy and scans an implantation surface of a substrate with an ion beam so as to implant the ion beam thereinto, the ion implantation device comprising:

a chamber divided type ion beam scanning mechanism constituted so that:

first to nth and nth to N+2nd chambers for allowing the ion beam to pass through are arranged in predetermined places on a beam line of the ion implantation device in this order from an upper stream side, an n−1st gap intervenes between the n−1st chamber and the nth chamber, and a nth gap intervenes between the nth chamber and the n+1st chamber, the nth chamber is electrically insulated from the n−1st and n+1st chambers via the n−1st and nth gaps, and any one of the n−1st and nth gaps obliquely crosses a standard axis of the ion beam at a predetermined angle, the nth chamber is connected to a scanning power source which applies an electric potential having desired scanning waveform, however, N is a natural number, n is a natural number from 2 to N+1 which shifts one by one.

3. An ion implantation device which draws out desired ion species from an ion source for creating ions, accelerates or decelerates the ion species into desired energy and scans an implantation surface of a substrate with an ion beam so as to implant the ion beam thereinto, the ion implantation device comprising:

a chamber divided type ion beam scanning mechanism constituted so that:

first, second and third chambers for allowing the ion beam to pass through are arranged in predetermined places on a beam line of the ion implantation device in this order from an upper stream side, a first gap intervenes between the first chamber and the second chamber, and a second gap intervenes between the second chamber and the third chamber, the second chamber is electrically insulated from the first and third chambers via the first and second gaps, and the two first and second gaps obliquely cross a standard axis of the ion beam at a predetermined angle in opposite directions, the second chamber is connected to a scanning power source which applies an electric potential having desired scanning waveform.

4. An ion implantation device which draws out desired ion species from an ion source for creating ions, accelerates or decelerates the ion species into desired energy and scans an implantation surface of a substrate with an ion beam so as to implant the ion beam thereinto, the ion implantation device comprising:

a chamber divided type ion beam scanning mechanism constituted so that:

first to nth and nth to N+2nd chambers for allowing the ion beam to pass through are arranged in predetermined places on a beam line of the ion implantation device in this order from an upper stream side, an n−1st gap intervenes between the n−1st chamber and the nth chamber, and an nth gap intervenes between the nth chamber and the n+1st chamber, the nth chamber is electrically insulated from the n−1st and n+1st chambers via the n−1st and nth gaps, and the two n−1st and nth gaps obliquely cross a standard axis of the ion beam at a predetermined angle in opposite directions, the nth chamber is connected to a scanning power source which applies an electric potential having desired scanning waveform, however, N is a natural number, n is a natural number from 2 to N+1 which changes one by one.

5. An ion implantation device which draws out desired ion species from an ion source for creating ions, accelerates or decelerates the ion species into desired energy and scans an implantation surface of a substrate with an ion beam so as to implant the ion beam thereinto, the ion implantation device comprising:

a chamber divided type ion beam scanning mechanism constituted so that:

first, second and third chambers for allowing the ion beam to pass through are arranged in predetermined places on a beam line of the ion implantation device in this order from an upper stream side, a first gap intervenes between the first chamber and the second chamber, and a second gap intervenes between the second chamber and the third chamber, the second chamber is electrically insulated from the first and third chambers via the first and second gaps, and the two first and second gaps obliquely cross a standard axis of the ion beam at a predetermined angle in the same direction, the second chamber is connected to a scanning power source which applies an electric potential having desired scanning waveform.

6. An ion implantation device which draws out desired ion species from an ion source for creating ions, accelerates or decelerates the ion species into desired energy and scans an implantation surface of a substrate with an ion beam so as to implant the ion beam thereinto, the ion implantation device comprising:

a chamber divided type ion beam scanning mechanism constituted so that:

first to nth and nth to N+2nd chambers for allowing the ion beam to pass through are arranged in predetermined places on a beam line of the ion implantation device in this order from an upper stream side, an n−1st gap intervenes between the n−1st chamber and the nth chamber, and an nth gap intervenes between the nth chamber and the n+1st chamber, the nth chamber is electrically insulated from the n−1st and n+1st chambers via the n−1st and nth gaps, and the two n−1st and nth gaps obliquely cross a standard axis of the ion beam at a predetermined angle in the same direction, the nth chamber is connected to a scanning power source which applies an electric potential having desired scanning waveform, however, N is a natural number, n is a natural number from 2 to N+1 which changes one by one.

7. The ion implantation device according to claim 2, wherein a phase of the scanning waveform of the electric potential to be applied to the n+1st chamber is different by π from that of the scanning waveform of the electric potential to be applied to the nth chamber, but in this case, N in claim 2 is a natural number of two or more.

8. The ion implantation device according to claim 1, wherein a permanent magnet is arranged in at least one chamber composing the chamber divided type ion beam scanning mechanism so that magnetic flux perpendicularly crosses the surface to be scanned with the ion beam.

9. An ion implantation device which draws out desired ion species from an ion source for creating ions, accelerates or decelerates the ion species into desired energy and scans an implantation surface of a substrate with an ion beam so as to implant the ion beam thereinto, the ion implantation device comprising:

a chamber divided type ion beam scanning mechanism constituted so that:

a deflecting electric magnet for deflecting the ion beam is arranged on a beam line of the ion implantation device, first, second and third chambers for allowing the ion beam to pass through are arranged on the beam line near the deflecting electric magnet in this order from an upper stream side, the second chamber is arranged in a magnetic pole gap of the deflecting electric magnet, a first gap formed near an incident opening of the deflecting electric magnet for the ion beam intervenes between the first chamber and the second chamber, and a second gap formed near an output opening of the deflecting electric magnet for the ion beam intervenes between the second chamber and the third chamber, the second chamber is electrically insulated from the first and third chambers via the first and second gaps, the first gap near the incident opening of the deflecting electric magnet obliquely crosses a standard axis of the ion beam in an opposite direction to a deflection angle of the deflecting electric magnet, and the second gap near the output opening of the deflecting electric magnet obliquely crosses the standard axis of the ion beam in the same direction as the deflection angle of the deflecting electric magnet, the second chamber is connected to a scanning power source which applies an electric potential having desired scanning waveform.

10. An ion implantation device which draws out desired ion species from an ion source for creating ions, accelerates or decelerates the ion species into desired energy and scans an implantation surface of a substrate with an ion beam so as to implant the ion beam thereinto, the ion implantation device comprising:

a chamber divided type ion beam scanning mechanism constituted so that:

a deflecting electric magnet for deflecting the ion beam is arranged on a beam line of the ion implantation device, first, second and third chambers for allowing the ion beam to pass through are arranged on the beam line near the deflecting electric magnet in this order from an upper stream side, the second chamber is arranged in a magnetic pole gap of the deflecting electric magnet, a first gap formed near an incident opening of the deflecting electric magnet for the ion beam intervenes between the first chamber and the second chamber, and a second gap formed near an output opening of the deflecting electric magnet for the ion beam intervenes between the second chamber and the third chamber, the second chamber is electrically insulated from the first and third chambers via the first and second gaps, and the second gap near the output opening of the deflecting electric magnet obliquely crosses a standard axis of the ion beam in an opposite direction to a deflection angle of the deflecting electric magnet, the second chamber is connected to a scanning power source which applies an electric potential having desired scanning waveform.

11. The ion implantation device according to claim 1, wherein electrodes are attached to respective end surfaces of the chambers forming the respective gaps, respectively.

12. The ion implantation device according to claim 1, wherein an angle at which the respective gaps obliquely cross the standard axis of the ion beam is about 45°.

\* \* \* \* \*